(12) United States Patent
Lai et al.

(10) Patent No.: US 6,671,836 B1
(45) Date of Patent: Dec. 30, 2003

(54) METHOD AND APPARATUS FOR TESTING MEMORY

(75) Inventors: Lawrence Lai, San Jose, CA (US); Victor E. Lee, Santa Clara, CA (US); James A. Gasbarro, Mountain View, CA (US)

(73) Assignee: Rambus Inc., Los Altos, CA (US)

( * ) Notice: Subject to any disclaimer, the term of this patent is extended or adjusted under 35 U.S.C. 154(b) by 0 days.

(21) Appl. No.: 09/405,442

(22) Filed: Sep. 23, 1999

(51) Int. Cl.[7] .............................................. G11C 29/00
(52) U.S. Cl. ..................................................... 714/718
(58) Field of Search ................................ 714/718, 719, 714/727, 724, 725, 726, 733, 30; 365/201, 230.03, 189.01, 190; 710/48, 260, 303, 308, 20, 8, 305; 324/500, 765, 537; 712/32, 28, 33; 326/16; 713/300, 500, 601; 257/499, E27.001; 361/780; 703/20

(56) References Cited

U.S. PATENT DOCUMENTS

| | | | | |
|---|---|---|---|---|
| 5,138,619 A | * | 8/1992 | Fasang et al. | ............... 714/718 |
| 5,481,671 A | * | 1/1996 | Fujisaki | ....................... 365/201 |
| 5,710,934 A | * | 1/1998 | Bona et al. | .................. 714/724 |
| 5,774,684 A | * | 6/1998 | Haines et al. | ................ 710/305 |
| 5,818,772 A | * | 10/1998 | Kuge | .......................... 365/201 |
| 5,936,977 A | * | 8/1999 | Churchill et al. | .............. 714/26 |
| 6,044,481 A | * | 3/2000 | Kornachuk et al. | .......... 714/724 |

* cited by examiner

Primary Examiner—Phung M. Chung
Assistant Examiner—Guy Lamarre
(74) Attorney, Agent, or Firm—Vierra Magen Marcus Harmon & DeNiro LLP

(57) ABSTRACT

A method and apparatus for testing DRAM is described. The method and apparatus causes the DRAM pins to be reconfigured to provide a direct path between the memory core and the DRAM pins. This reconfiguration allows the memory core to be "seen" without probing and also allows faster and simpler testing with a more traditional protocol. The method and apparatus for testing also provides for several options to further increase testing speed. These options include an internal block compare and a core noise option. The internal block compare performs an internal parallel bit by bit comparison of read data to the contents of a write buffer and generates an error signal if a mismatch occurs. The core noise option simulates the noise that can occur during the normal mode of operation that does not occur during testing.

4 Claims, 17 Drawing Sheets

States and Rules of State Change for Dependent Bank Memory Core:
P = Precharged
S = Sensed
C = Column Read or Write
L = Locked 1) Cannot have S in adjacent banks.
2) If bank N=S, then banks (N-1) and (N+1) automatically go to L.

Legal transitions (all other transitions are illegal):
From  To
P     S
P     L (when an adjacent bank is sensed)
S     C or P
C     C or P
L     P (when both adjacent banks are precharged)

| Banks 0 1 2 3 4 5 6 7 8 9 | Step | Description |
|---|---|---|
| P P P P P P P P P P | 830 | Precharge bank 0<br>Latch 700 contains (0) |
| S L S L P L S L P P | 840 | Sense banks 0, 2, 6<br>Latch 730 contains (6) |
| P P P L S L C L P P | 850 | Assert CoreNoiseSel<br>Sense bank 4<br>Precharge bank [(Latch 700)+1]=1<br>Column bank (Latch 730)=6 |
| P P P P P P P P P P | 860 | Precharge bank 5 |
| P P P P P P P P P P | 870 | Precharge bank 1<br>Latch 700 contains (1) |
| L S L S L P L S L P | 880 | Sense banks 1,3,7<br>Latch 730 contains (7) |
| P P P P L S L C L P | 890 | Assert CoreNoiseSel<br>Sense bank 5<br>Precharge bank [(Latch 700)+1]=2<br>Column bank (Latch 730)=7 |
| P P P P P P P P P P | 895 | Precharge bank 6 |

STAGE 1 — 810 (steps 830, 840, 850)
STAGE 2 — 820 (steps 870, 880, 890)

*FIG. 8*

States and Rules of State Change for Dependent Bank Memory Core:
P = Precharged
S = Sensed
C = Column Read or Write
L = Locked 1) Cannot have S in adjacent banks.
2) If bank N=S, then banks (N-1) and (N+1) automatically go to L.

Legal transitions (all other transitions are illegal):
From   To
P      S
P      L (when an adjacent bank is sensed)
S      C or P
C      C or P
L      P (when both adjacent banks are precharged)

```
                Banks
                0 1 2 3 4 5 6 7 8 9    Step   Description
              ┌ P P P P P P P P P P    1015   Precharge bank 1
              │                                Latch 900 contains (1)
              │
    STAGE  ┤   S L S L P L S L P P     1020   Sense banks 0, 2, 6
      1    │                                   Latch 930 contains (6)
              │
              └ P P P L S L C L P P    1025   Assert CoreNoiseSel
                 ─1005                         Sense bank 4
                                               Precharge bank (Latch 900)=1
                                               Column bank (Latch 930)=6

P P P P P P P P P P    1030   Precharge bank 5

┌ P P P P P P P P P P    1035   Precharge bank 2
              │                                Latch 900 contains (2)
              │
    STAGE  ┤   L S L S L P L S L P     1040   Sense banks 1,3,7
      2    │                                   Latch 930 contains (7)
              │
              └ P P P P L S L C L P    1045   Assert CoreNoiseSel
                 ─1010                         Sense bank 5
                                               Precharge bank (Latch 900) = 2
                                               Column bank (Latch 930)=7

P P P P P P P P P      1048   Precharge bank 6
```

*Fig. 10A*

States and Rules of State Change for Independent Bank Memory Core:
P = Precharged
S = Sensed
C = Column Read or Write Legal transitions (all other transitions are illegal):
| From | To |
|------|------|
| P | S |
| S | C or P |
| C | C or P |

| Banks 0 1 2 3 | Step | Description |
|---|---|---|
| P P P P | 1060 | Precharge bank 0<br>Latch 900 contains (0) |
| S P S P | 1065 | Sense banks 0, 2,<br>Latch 930 contains (2) |
| P S C P | 1070 | Assert CoreNoiseSel<br>Sense bank 1<br>Precharge bank (Latch 900)=0<br>Column bank (Latch 930)=2 |
| P S P P | 1075 | Precharge bank 2 |
| P P P P | 1080 | Precharge bank 1<br>Latch 900 contains (1) |
| P S P S | 1085 | Sense banks 1,3<br>Latch 930 contains (3) |
| P P S C | 1090 | Assert CoreNoiseSel<br>Sense bank 2<br>Precharge bank (Latch 900) = 1<br>Column bank (Latch 930) = 2 |
| P P S P | 1095 | Precharge bank 2 |

*Fig. 10B*

METHOD AND APPARATUS FOR TESTING MEMORY

FIELD OF THE INVENTION

The present invention pertains to the field of semiconductor memory testing, and more particularly, to the testing of dynamic random access memory (DRAM).

BACKGROUND OF THE INVENTION

There is a need to test dynamic random access memories (DRAMs) to ensure that the device operates properly according to the specification. The methods most commonly employed for testing DRAM involve writing a string of 1's or 0's into every address space and then reading from every address space. Another method involves writing a specific pattern of 1's and 0's, for example a checker board pattern, into every address space, then reading from every address space.

One disadvantage of this process is that it is slow. It takes time to write to and read from every address space of a large DRAM. Another disadvantage is that there are certain errors that cannot be detected by this method. It is desirable to have a memory testing apparatus and method that can detect as many errors as possible.

SUMMARY AND OBJECTS OF THE INVENTION

In view of the limitations of known memory and methods of testing memory, one of the objects of the present invention is to provide an improved method and apparatus for allowing a user to "see" inside a memory device without probing.

Another object of the present invention is to provide an improved method and apparatus for performing tests on protocol based memories.

These and other objects of the invention are provided for by a method and apparatus for a test mode for memory testing. A memory is described. The memory has a plurality of pins. The memory also has a memory core. A memory interface receives a signal to reconfigure the functionality of the interface to provide a direct path between the plurality of pins and the memory core.

Other objects, features, and advantages of the present invention will be apparent from the accompanying drawings and from the detailed description that follows.

BRIEF DESCRIPTION OF THE DRAWINGS

The present invention is illustrated by way of example and not limitation in the Figures of the accompanying drawings, in which like references indicate similar elements, and in which:

FIG. 8 shows one embodiment of the bank testing performed by the core noise logic.

FIG. 10A is an illustration of another embodiment the banks tested by the core noise logic 300.

FIG. 10B is an illustration of yet another embodiment of the banks tested by the core noise logic 300.

DETAILED DESCRIPTION

The present invention defines a test mode to test a dynamic random access memory (DRAM). The test mode enables a user to "see" inside the device without probing. For one embodiment, the test mode also enables the use of a simple and traditional test protocol that can be used by existing memory testers. The protocol does not use the high speed complex protocol used by some DRAMs during normal operation. This permits the use of slower and cheaper testing devices. The test increases throughput, making the test more efficient, while using a slower clock. In addition to the basic functionality, the test mode offers selectable options for test time reduction. These options may include: an internal block read compare option, shown in FIGS. 4 and 5, and a core noise option, shown in FIGS. 6–8.

Figure 1:
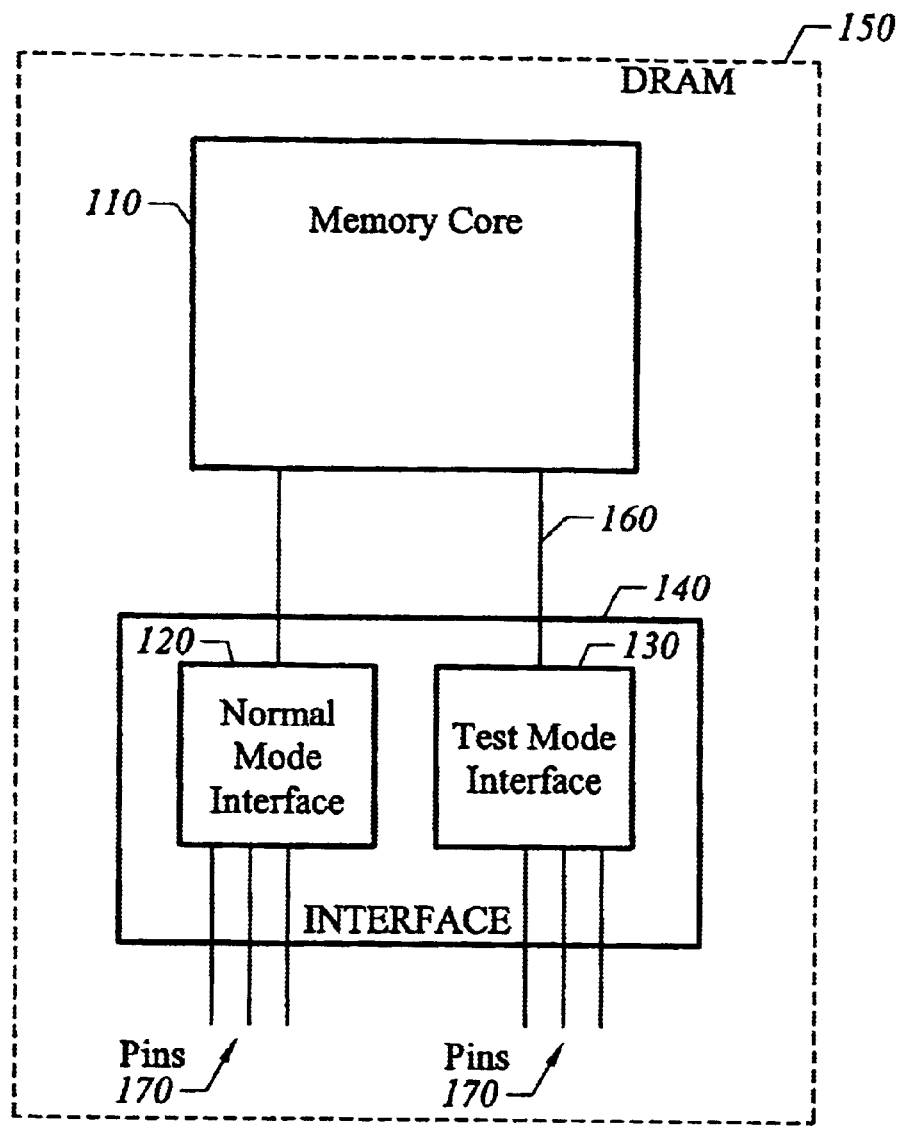
FIG. 1 shows a block diagram of one embodiment of a dynamic random access memory (DRAM) that includes circuitry for a test mode interface.

FIG. 1 shows an overview block diagram of a DRAM 150 having a memory core 110 and a memory interface 140. The memory interface 140 can operate in a normal mode or a test mode. The test mode, for one embodiment, is a direct access test mode that may be referred to as DA mode. The test mode interface 130 is used to run tests on the DRAM when the memory is in test mode. Test mode causes the functionality of the DRAM pins to be redefined to provide a direct path between at least some of the pins 170 and memory control signals 160. This direct path is shown in more detail in FIG. 2.

Test mode has several applications. These applications include wafer probe testing, burn-in testing, final testing, and module testing.

The primary goal of wafer probe testing is to identify exactly which bits are bad within the DRAM core. Wafer probe tests can be classified into two types of tests: short cycle and long cycle. Short cycle tests use short length row address strobe (RAS) cycles to write/read data to/from the core. For one embodiment, these tests use concurrent row operations for reads and writes. Bad bit identification is done by reading out all of the data and using an external comparison, or by using an internal read comparison mechanism to improve speed. The internal read comparison mechanism identifies if a data error exists within a block of data, but does not identify individual failing bits. If a data error is found, the actual bad bit may be separately identified.

Long cycle tests require a row sense signal (BSENSE) to be held low for the maximum duration between a write and a read operation to the same bank. For these types of tests, the key to efficiency is to maximize the number of banks that are operating in parallel. The test mode allows a large number of banks to be activated in parallel. Concurrent bank write and read operations may be used to minimize test time.

Burn-in testing stresses the DRAM with high temperature and high voltage. The requirements for burn-in tests vary depending on whether the manufacturer wants to perform core testing (monitored burn-in) during the burn-in test or simply toggle internal logic nodes. For the non-monitored burn-in case, any of the test mode core access options work. External data comparison is desirable because external comparison toggles more nodes in the circuit.

For monitored burn-in, either the internal or external comparison option is chosen. For one embodiment, in the burn-in environment multiple devices are bussed together on each set of tester channels. If internal data comparison is used, an SIO1 (serial input/output) signal from each device is individually returned to the burn-in test hardware to allow detection of the failing device. External comparison uses a mechanism that allows devices to be individually read back. This can be accomplished by providing a separate test data strobe signal (TestDSTB) that determines when data is loaded to each device. One device at a time is strobed to load the output shift register. This approach allows all other devices on the bus to be toggled while data from one device is being read and compared.

The final test is similar to the wafer probe test in that there is a combination of short and long cycle tests. The primary difference between the final test and the wafer probe test is that the failing bit information is not used in the final test. The final test only indicates whether the DRAM is good or bad. Increasing the number of banks activated in parallel improves the average test time at the expense of a slightly more complex test program. The internal block comparison mechanism, described below with respect to FIGS. 4 and 5, is well suited for this task and is faster than the external comparison.

Figure 11:
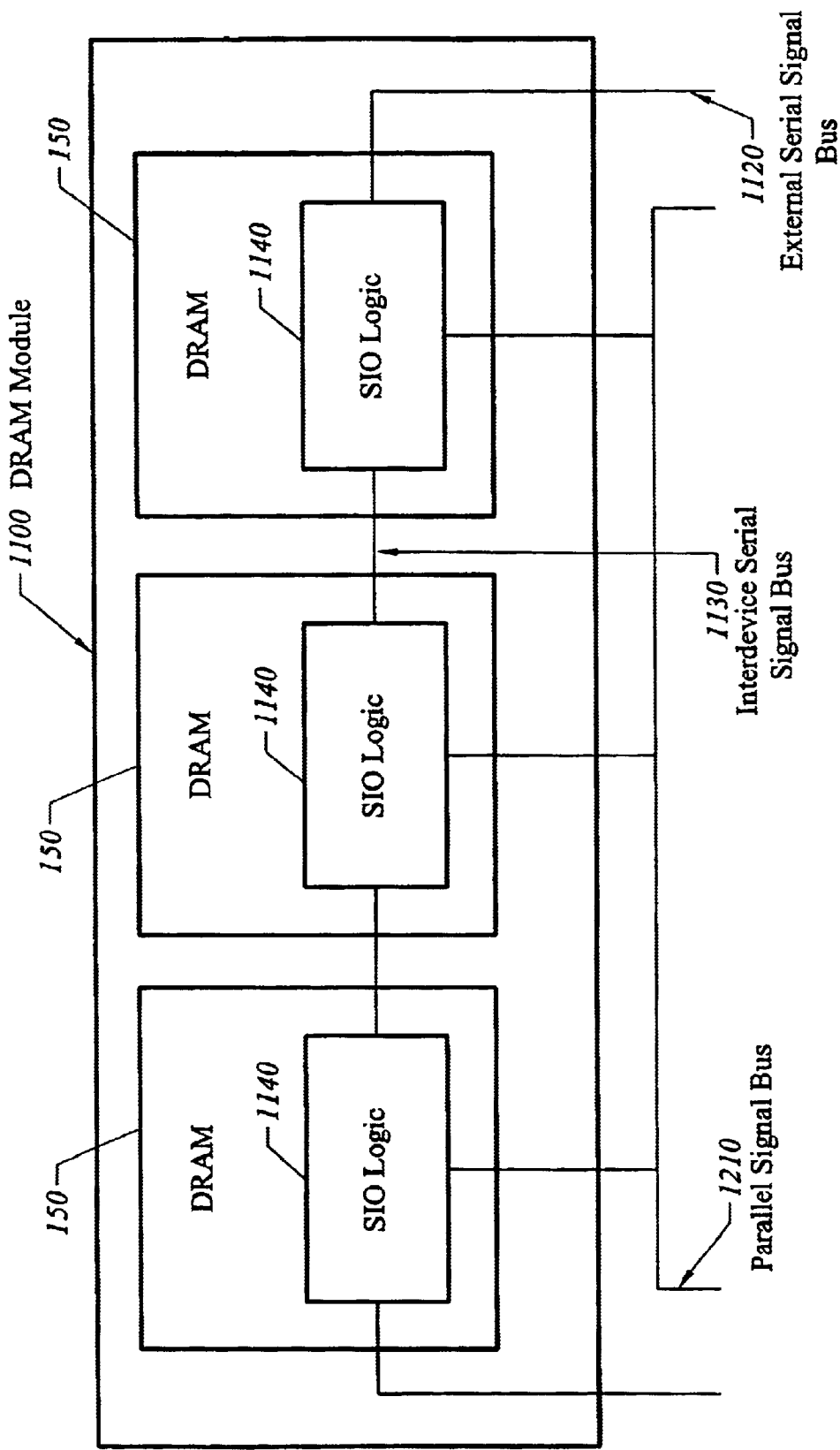
FIG. 11 shows one embodiment of a module for module testing.

The module test, illustrated in FIG. 11, is similar to burn-in in that the pins of each DRAM 150 are connected in parallel. The module test can be accomplished by using either the external data comparison or the internal block data compare mechanism. If external comparison is used, only one device 150 on the module 1100 can be tested at a time using parallel signal bus 1210 for the comparison data. Using of the internal compare feature allow's all of the devices on the module 1100 to be tested in parallel.

Figure 2:
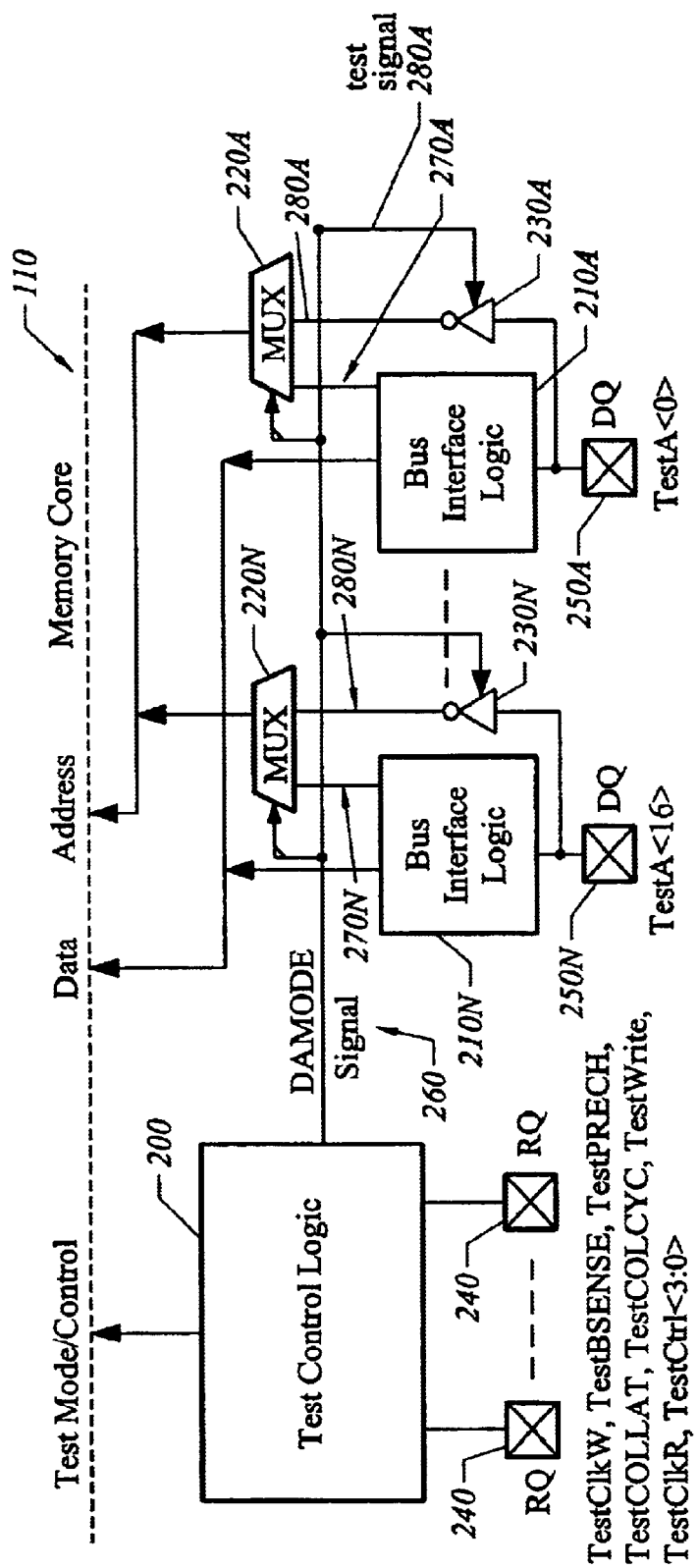
FIG. 2 shows one embodiment of a test mode interface logic.

FIG. 2 is a logic diagram of one embodiment of the test mode interface logic 130 of FIG. 1. Test mode uses additional logic not used for a normal mode of operation. For one embodiment, the test mode interface logic 130 includes a test control logic 200, and for each line, A–N, a bus interface logic 210A, a multiplexer 220A, and a buffer 230A. The bus interface logic 210A is used in normal mode. The buffer 230A is coupled between a DQ pin 250A and the multiplexer 220A. For one embodiment, the DQ pin 250A carries a portion of a test address signal. The test addresses flow through buffer 230A and multiplexer 220A. The multiplexer 220A selects the output signal 270A of the bus interface logic 210A or the output signal 280A of the buffer 230A.

For one embodiment, there are a plurality of DQ pins 250A–N. For one embodiment, each of these pins has an associated bus interface logic 210A–N, buffer 230A–N, and multiplexer 220A–N.

Figure 3:
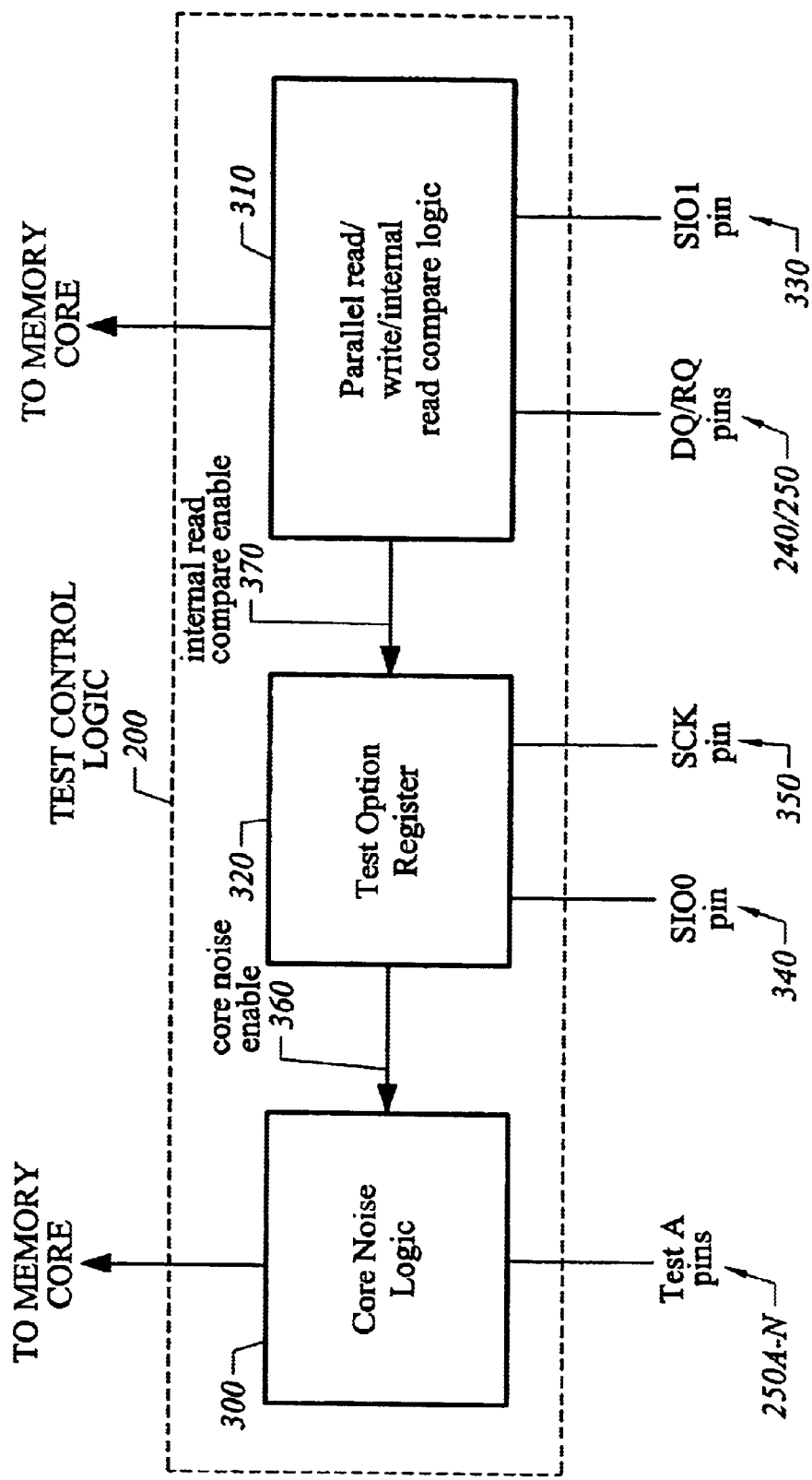
FIG. 3 shows a detailed block diagram of one embodiment of a test control logic block diagram.

For one embodiment, the test control logic 200, shown in more detail in FIG. 3, includes the additional logic used for the test mode options, such as the parallel read/write logic for the internal block compare option and the core noise logic for the core noise option.

The test control logic 200 outputs a test mode select signal 260 to multiplexer 220A. The normal signal 270A and test signal 280A are inputs to the multiplexer 220A. The normal signal 270A is an output signal of the bus interface logic 210A. The test signal 280A is an output signal of buffer 230A. If the memory is in test mode, the test mode select signal 260 selects the test signal 280A in the multiplexer 220A. The test mode select signal 260 carries through to other multiplexers 220A–N, similarly selecting either the test signal 280A–N or the normal signal 270A–N.

For one embodiment, the memory core 110, as illustrated in FIG. 1, is divided into sixteen banks, each organized as 512 rows, with each row containing 64 dualocts. A dualoct is 16 bytes and the smallest unit of data that can be addressed. Alternative numbers of banks, rows and address units may also be implemented. The DRAM 150, shown in FIG. 2, also has several pins 240 and 250A–N. The pins include DQ pins 250A–N. In normal mode, DQ pins 250A–N carry read and write data. In test mode the DQ pins 250A–N carry test signals with address and data information, Test A. In normal mode SIO0 and SIO1 are for reading from and writing to control registers using a serial access protocol. In test mode these pins carry register input/output data as well as special test outputs, such as internal read compare results. The DRAM also has RQ pins 240. In normal mode, RQ pins 240 carry control and address information. In test mode the RQ pins 240 carry memory control signals.

For one embodiment, the memory control signals on the RQ pins 240, shown in FIG. 2, include BSENSE, PRECH, COLCYC, COLLAT, WRITE, PBSEL, CBSEL, RADR, and CADR. The BSENSE signal is a row sense signal. The PRECH signal is a row precharge signal. The COLCYC signal is a column cycle signal that enables the column input/output amplifiers. The COLLAT signal is a column address latch signal. The WRITE signal indicates whether a column operation is a read or a write. The PBSEL signal is the address of a selected bank for precharge. The CBSEL signal is the address of the selected bank for column access. The RADR signal contains both the bank and selected row information. The CADR signal is a column address signal.

Test mode can be entered in several ways. For one embodiment, test mode is entered by setting a register bit, the EnterDAMode register bit, using a standard register operation. For another embodiment, test mode is entered by sending a command packet that resets a serial input/output signal followed by setting the test mode control bit. For one embodiment, command packets are either one or two cycles long, sampled on both edges of a clock (SCK), beginning with the falling edge. For one embodiment, the command packets are dependent upon the state of the SIO0 signal. For one embodiment, command packets cannot overlap.

FIG. 3 shows one embodiment of a more detailed block diagram of the test control logic 200. The test control logic 200 includes a parallel read/write logic 310 shown in more detail in FIGS. 4 and 5, a core noise logic 300 shown in more detail in FIGS. 6–8, and a test option register 320.

For one embodiment, a test option serial register 320 (TO register), as shown in FIG. 3, is used for selection of test mode options. For one embodiment, the TO register 320 is a shift register serially loaded with data from SIO0 340 and clocked by SCK 350. The contents of the TO register 320 are used to define options of the current test. The TO register 320 includes a core noise enable bit 360 and an internal read compare bit 370. Other vendor specific options may be added.

For normal (non-block) test mode operations, read and write signals are carried on the DQ pins 250 in the same bit ordering as in normal DRAM operation. A clock is needed to serially write into or read out a block. For one embodiment, a TestClkR clock signal is used to clock read operations. A TestClkW clock signal is used for loading the write buffer. For one embodiment, TestClkR and TestClkW have the same frequency, however, they are not on simultaneously. For one embodiment, a multiplexer can be used to direct a continuous clock source to TestClkR or TestClkW.

For one embodiment, memory operations use a protocol called High Bandwidth test mode. High Bandwidth test mode offers three enhancements: (1) a parallel block write requiring only one data bit, (2) an internal read compare for checking read data against write buffer content (shown in FIG. 4), and (3) a read/write data strobe signal.

For one embodiment, the read/write data strobe signal, TestDSTB, provides more flexibility in data alignment and clocking. The TestDSTB signal decouples data packet timing from clock enabling. This enables packet data timing without turning the clock on and off. The TestDSTB signal also can be used as an effective chip select signal.

The clock can be enabled for a long rapid burst. During a read operation, TestDSTB is sampled on the rising edge of TestClkR. For one embodiment, the first byte of data appears on the DQ pins at the second falling edge of TestClkR after the TestDSTB strobe signal is sampled. During a write operation, the first byte of input data is sampled on the first falling edge of TestClkW. TestDSTB is sampled on the second falling edge of TestClkW after the start of the data. During a block write operation, the first byte of data is sampled on the first falling edge of TestClkW. TestDSTB is sampled on the first falling edge of TestClkW after the start of data.

Figure 4A:
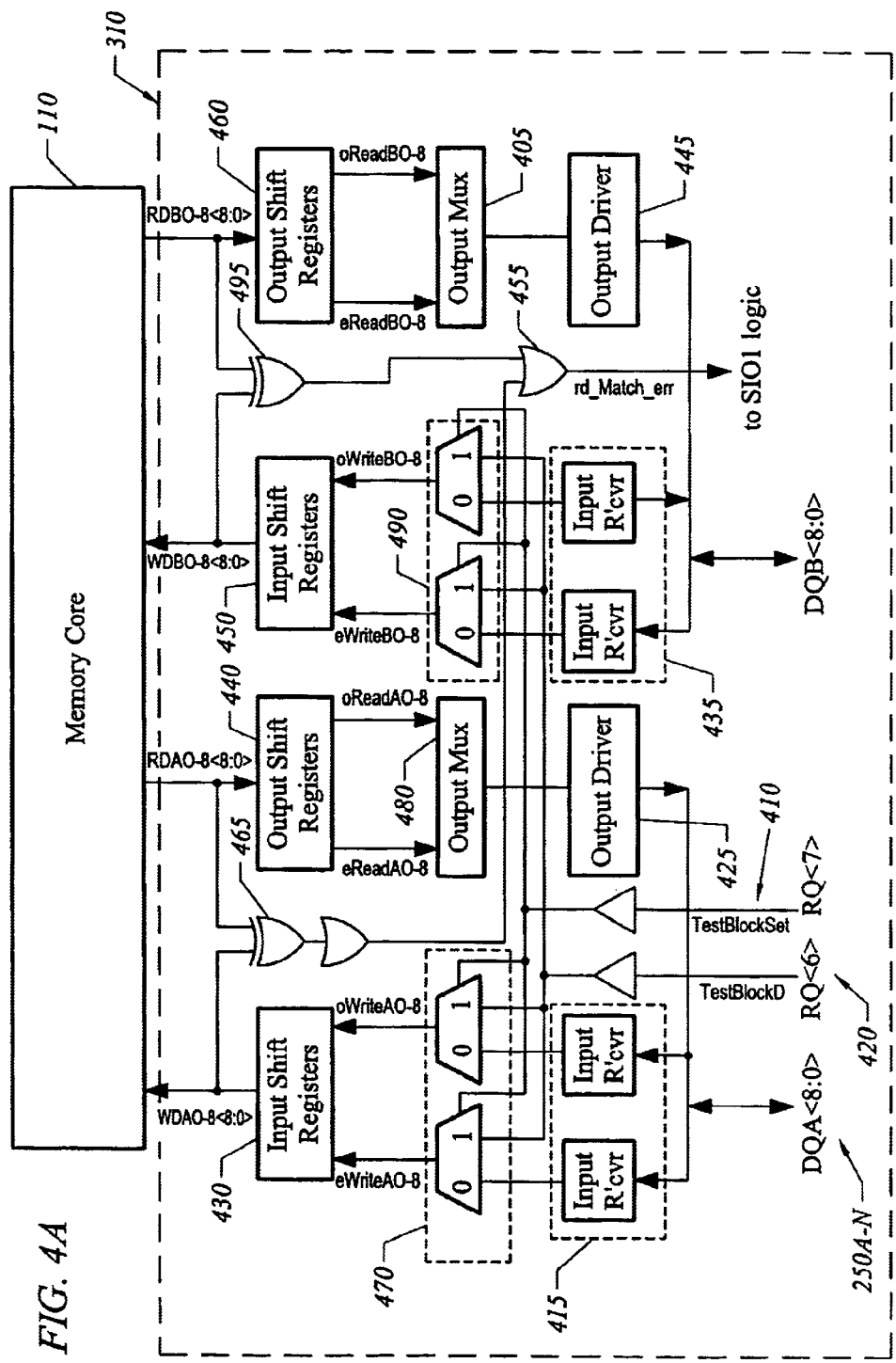
FIG. 4A shows one embodiment of a read/write logic including an internal parallel read/write logic circuit and an internal read compare logic.
Figure 5:
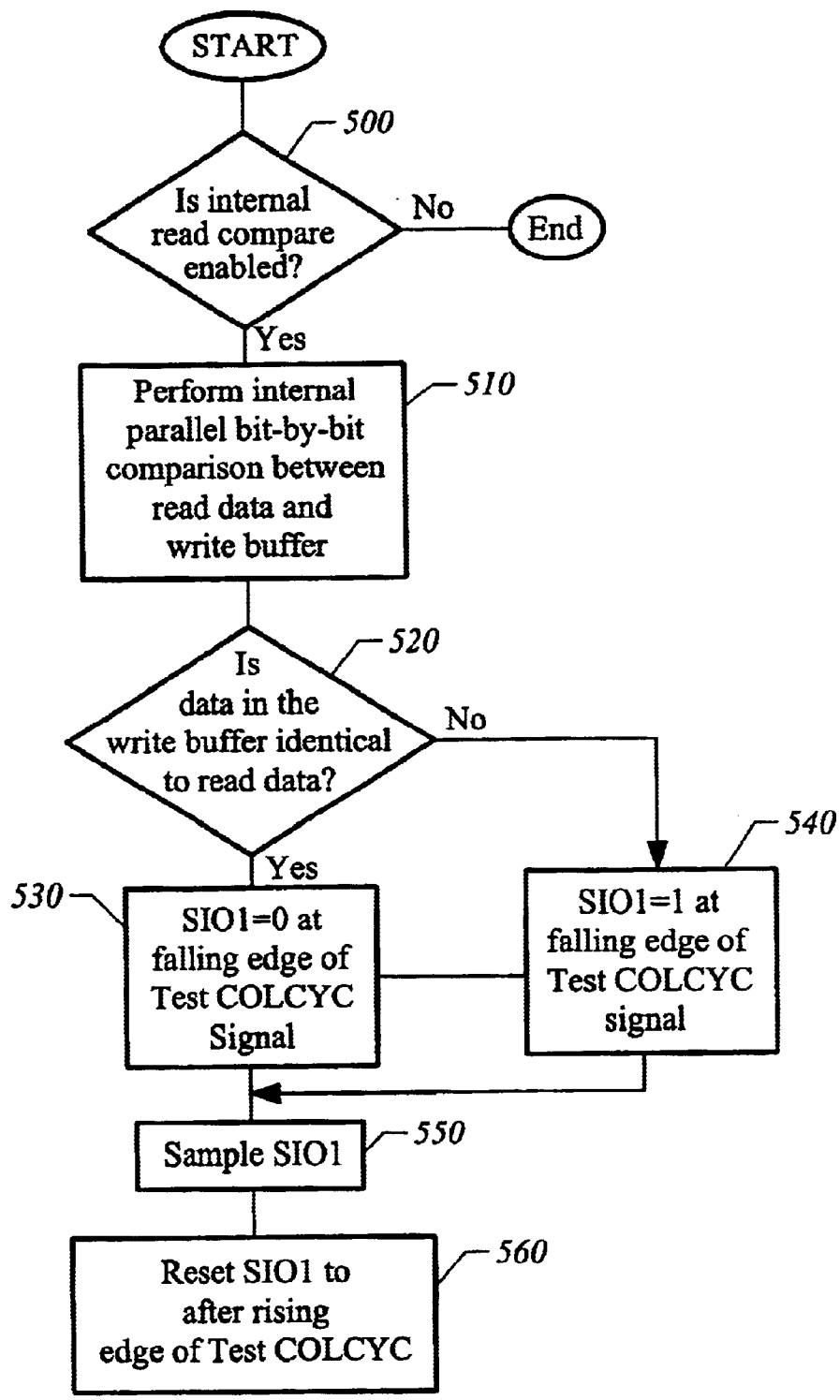
FIG. 5 shows one embodiment of a flow chart for an internal read compare.

FIG. 4A shows logic for performing a read, a write, a parallel read/write, and an internal read compare.

Figure 4B:
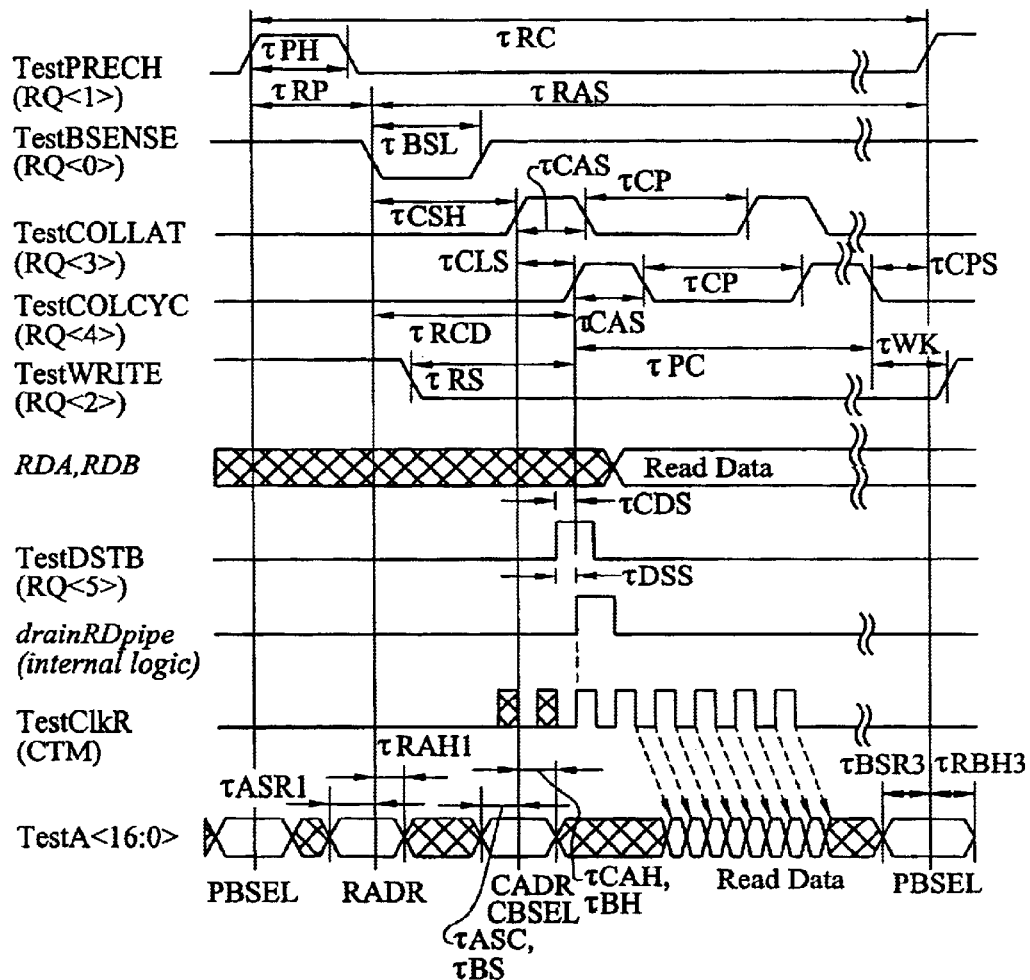
FIG. 4B is a waveform diagram of one embodiment of a read operation.

The logic for the read operation includes an output shift register 440, an output multiplexer 480, and an output driver 425. One embodiment of a read operation is shown in FIG. 4B. First, the row address and bank select bits are loaded on the falling edge of the TestBSENSE signal. A column address is loaded on the rising edge of the TestCOLLAT signal. The TestWRITE signal low indicates that a read cycle is selected. Column access is triggered on the rising edge of the TestCOLCYC signal. When TestClkR samples TestDSTB=1 on a rising edge, the data is shifted out starting on the second falling edge of TestClkR. TestDSTB and TestClkR load output shift register 440. For one embodiment, once this output shift register 440 is loaded, the only way to clear it is by providing an additional five TestClkR pulses. If the data is not properly cleared, it could interfere with address or data input during a later operation. For one embodiment, none of the control signals affect the contents of the shift register 440.

The data and address information is selected using multiplexer 480, and output through an output driver 425 onto the DQ pins 250. For one embodiment, there are two sets of DQ pins, DQA and DQB. Similar read logic, including output shift register 460, output multiplexer 405, and output driver 445, is used to read to the second set of DQ pins.

Figure 4C:
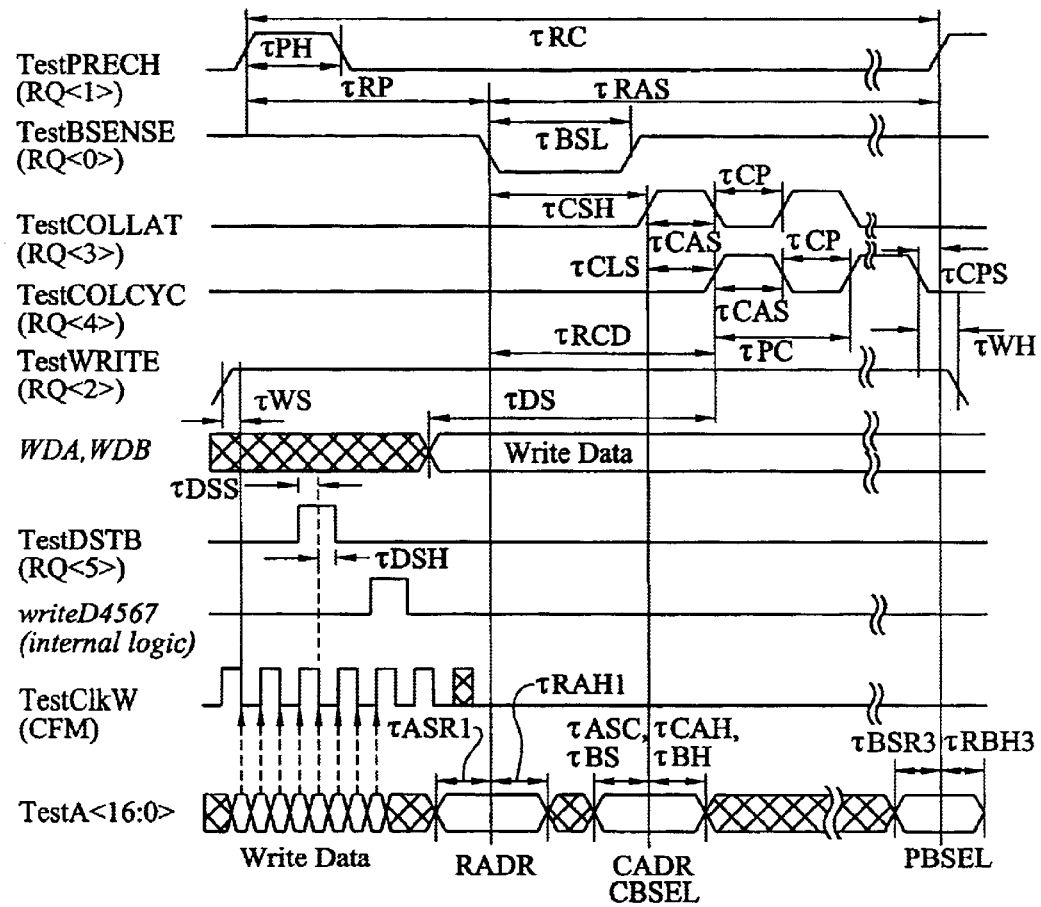
FIG. 4C is a waveform diagram of one embodiment of a write operation.

The logic for the write operation includes an input shift register 430 and a pair of input receivers 415. One embodiment of the test mode write operation is shown in FIG. 4C. The data must be loaded into the input shift register 430 before the RAS/CAS cycle begins. The data is placed in an input receiver 415 prior to being loaded into the input shift registers 430. The data is clocked with TestClkW. The TestDSTB signal should have a logic value of "1" on the third falling edge of TestClkW after the start of the data packet. The TestWRITE signal should be set high during both the data loading by the input receivers and when data is being written to the memory core by TestCOLCYC. After the write data is loaded, it is written to the core. A similar set of write logic including input shift register 450 and input receivers 435 is used to write from the second set of DQ pins.

The logic required for a parallel (block) write operation includes the write logic and a pair of multiplexers 470 to select either a write signal or a parallel write signal. For one embodiment, the multiplexers 470 receive inputs from the input receivers 415 (used for write operations) and from a TestBlockD signal 420 (the data signal for parallel write operations).

Parallel write operations allow one pin to supply the data value for each of the internal DQ sub-arrays. The device is clocked on four cycles as usual, but only one data pin is needed instead of 16 or 18. The DQ pins 250A–N are available for providing a column address, CADR and bank CBSEL, in parallel with the write data. This mode reduces the test time.

Figure 4D:
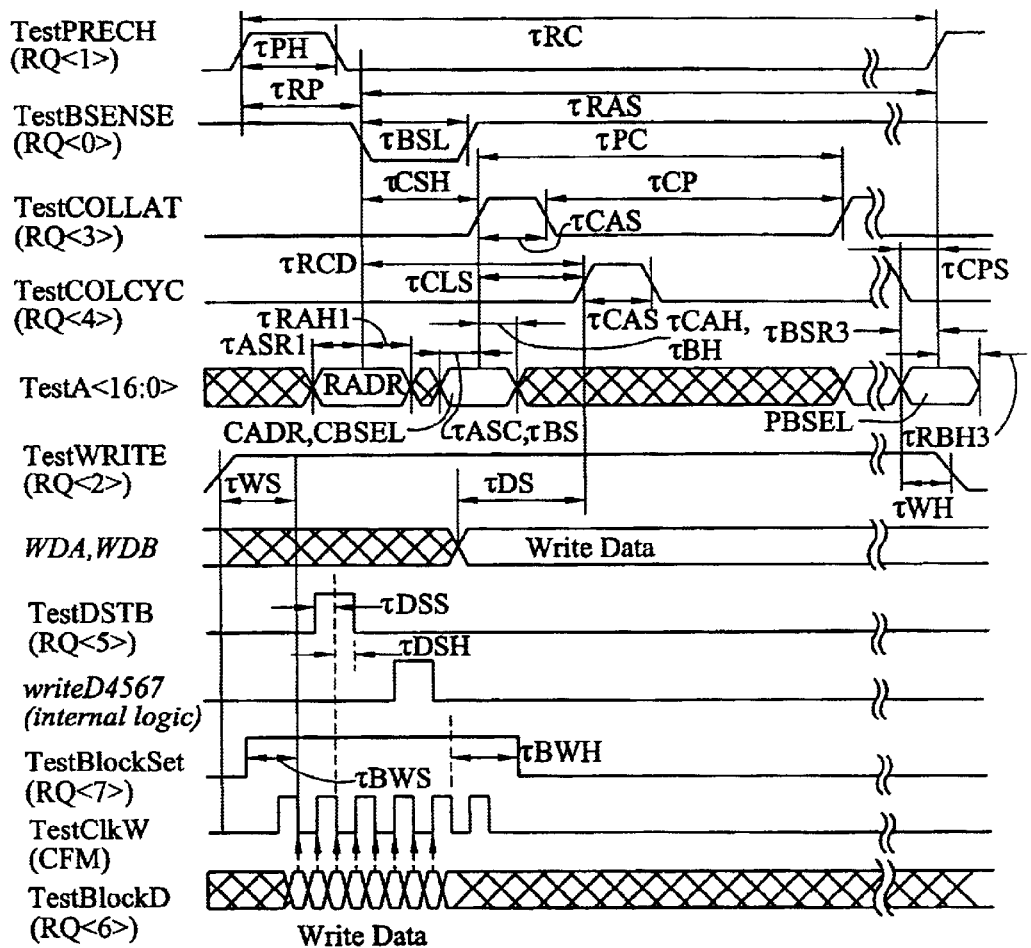
FIG. 4D is a waveform diagram of one embodiment of a parallel block write operation.

One embodiment of the parallel block write operation is shown in FIG. 4D. For one embodiment, the parallel block write operates if a TestBlockSel signal 410 is asserted. If the TestBlockSel signal 410 is asserted, then all the input/output bits receive their write data from TestBlockD 420 allowing the DQ pins 250A–N to be simultaneously available for address information. The TestBlockSel signal 410 is the select signal for the multiplexer 470, and the TestBlockD signal 420 is the data signal. In parallel block write mode, the TestBlockD signal data is selected using multiplexer 470. Thus, the input receivers 415 are bypassed during a parallel write operation.

Figure 4E:
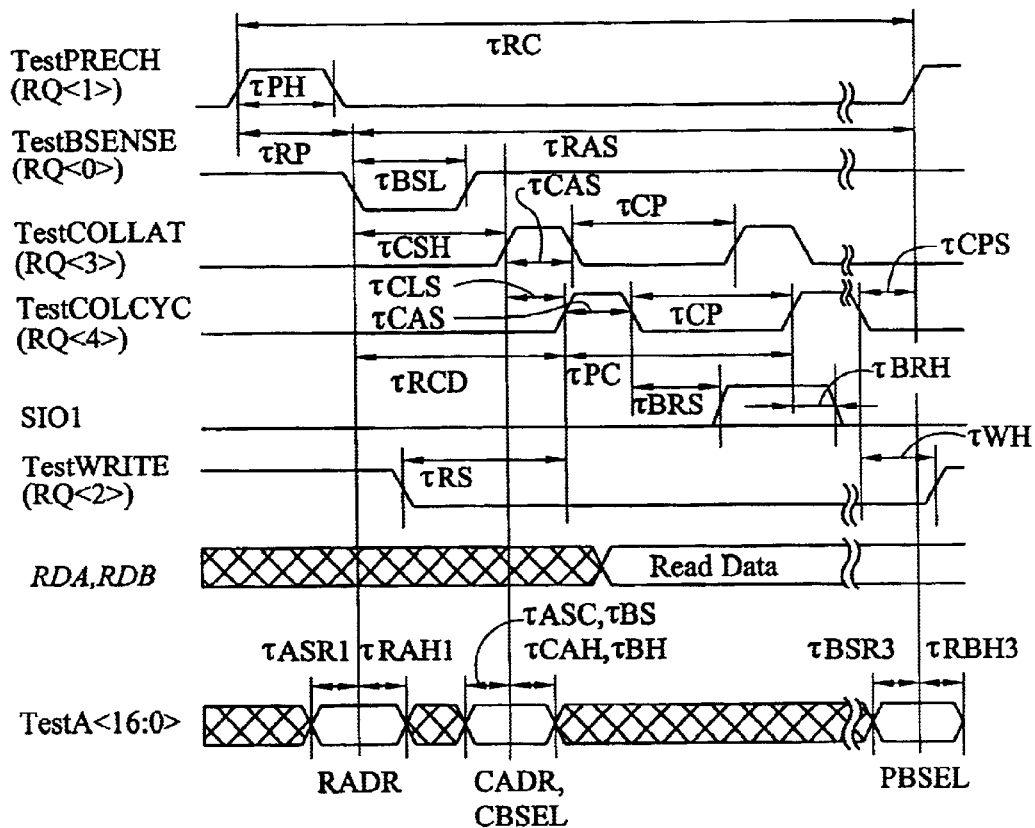
FIG. 4E is a waveform diagram of one embodiment of a parallel block read/compare operation.

Parallel write timing is the same as write operation timing, with the following exceptions. The mode is activated by setting the TestBlockSel signal 410. The TestDSTB signal should occur one cycle earlier than in the test mode write operation, due to the bypass of the input receiver 415. A similar set of logic including multiplexers 490 is used to perform a parallel write operation to the second set of DQ pins. FIG. 4E is one embodiment of a waveform diagram of parallel read/compare.

FIG. 4A shows logic used for an internal read compare with a corresponding timing diagram shown in FIG. 4E. For one embodiment, the parallel read compare logic includes an OR gate 455 and XOR gates 465 and 495 for comparing write data to read data. For one embodiment, the inputs to XOR gate 465 are the input to the read output shift register 440 and the output of the write input shift register 430 for the first set of DQ pins. The inputs to the other XOR gate 495 are the corresponding inputs and outputs for the second set of DQ pins. The outputs of the two XOR gates 465 and 495 are input into OR gate 455. The output of OR gate 455 is a match or mismatch signal on the SIO1 pin.

FIG. 5 shows a flowchart for one embodiment of an internal read compare operation. The internal read operation is enabled by setting an internal read operation control register bit. For one embodiment, the bit is set by a register write. For another embodiment, the bit is set through a test mode test option register load. For one embodiment, at block 500 the process tests whether the internal read compare enable register bit is equal to one. For one embodiment, the enable register bit is S_is_ERR. For one embodiment, if the register bit is not equal to one, the internal read compare is not enabled, and the process is ended. For one embodiment, if the internal read compare enable register bit is equal to one, the process continues to block 510.

At block 510, an internal parallel bit-by-bit comparison between read data and write buffer is performed. At block 520, the read data is compared to data in the write buffer. For one embodiment, if the read data is not identical to the data in the write buffer, a one is driven onto SIO1 after the falling edge of the TestCOLCYC signal. For one embodiment, if the read data is identical to the data in the write buffer, a zero is driven onto SIO1 after the falling edge of the TestCOLCYC signal. Regardless of whether the read data is identical to the data in the write buffer, the process continues to step 550. Step 550 resets SIO1 on the rising edge of the TestCOLCYC signal. For one embodiment, the data may also be read out through the DQ pins as shown in FIG. 4B.

FIG. 11 is a block diagram of one embodiment of a module for testing. For one embodiment, a module 1100 is a unit including one or more memory devices. For one embodiment, the module 1100 is a printed circuit board. Each device 150 includes a parallel signal bus 1110 and an SIO logic 1140 having as an input an external serial signal bus 1120. If an error occurs, the error flag ripples through the serial input/output chain 1120, 1130 and appears on the output of the last device on the chain 1120.

Figure 12:
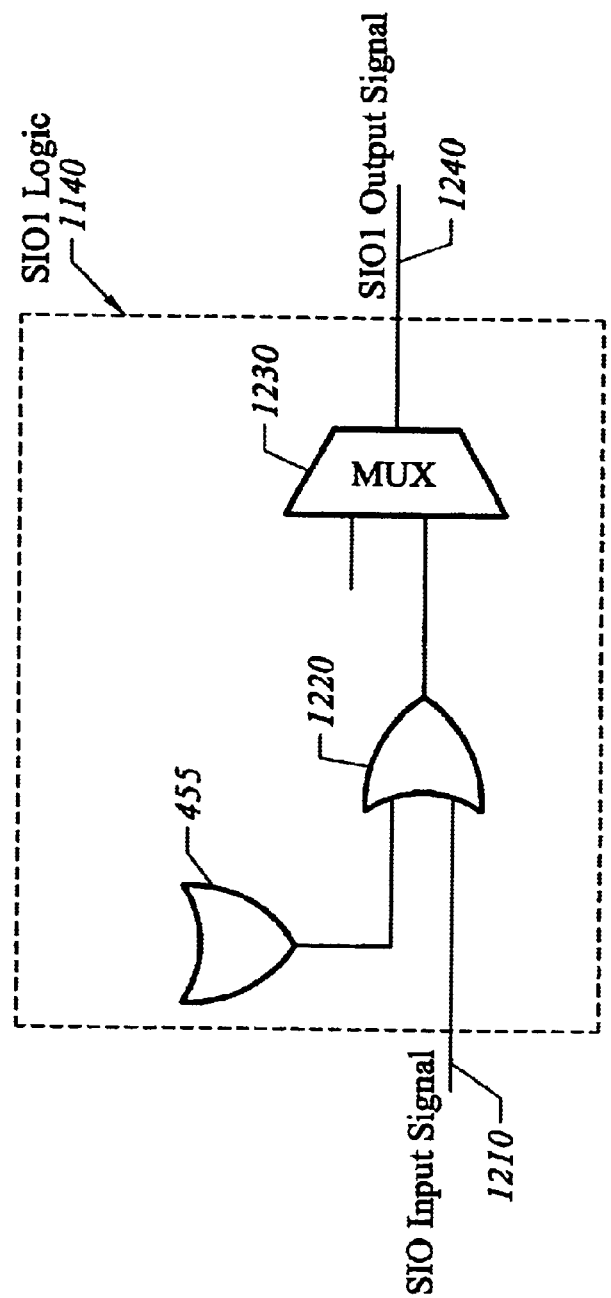
FIG. 12 shows one embodiment of an SIO logic diagram for module testing.

One embodiment of the SIO logic 1140 is illustrated in FIG. 12. The input to the SIO logic 1140 is an SIO0 signal. The SIO logic 1140 includes an internal compare result driver 455, having an output that is an input to an inter-device compare logic OR gate 1220. The output of the OR gate 1220 is an input to a normal/test mode selection multiplexer (MUX) 1230. The output of the MUX 1230 is the SIO1 output signal 1240, which is propagated as an SIO input signal to the next device.

Figure 6:
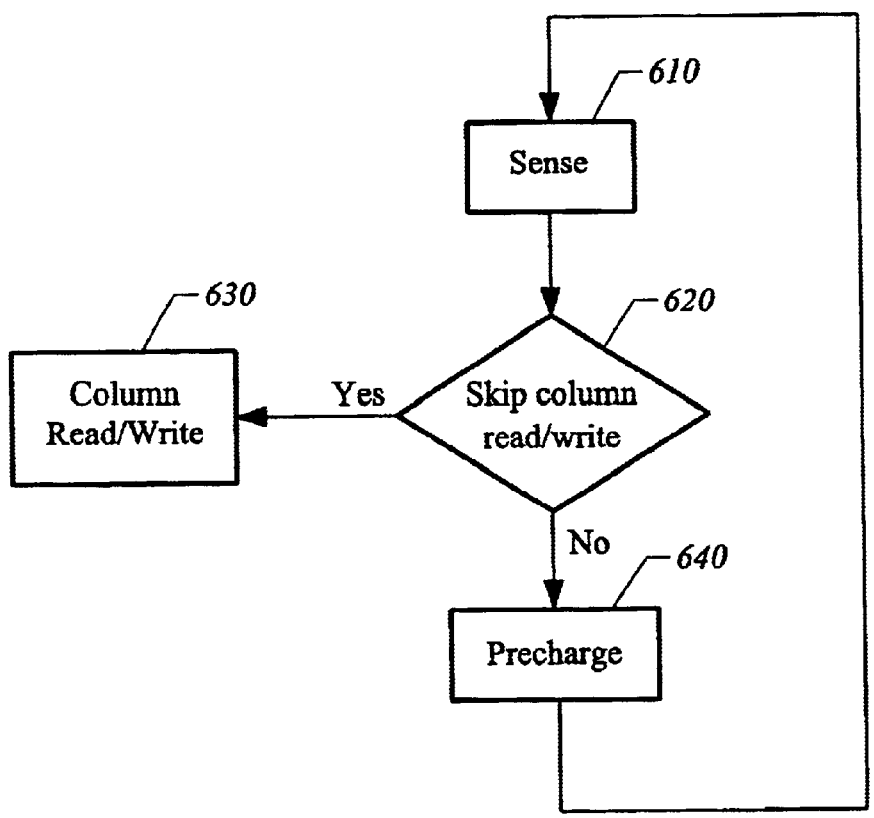
FIG. 6 is a flowchart of one embodiment of a cyclical DRAM operation for a bank used for the core noise test mode.

FIG. 6 is a flowchart showing one embodiment of the cyclic nature of DRAM operations used for the core noise option. The core noise option enables internal address latches to simulate worst case concurrent memory operations. Contemporary DRAMs feature concurrent multi-bank operations to increase overall efficiency. That is, more than one bank may be in use simultaneously. Each operation requires a set of address or bank select interfaces, so supporting concurrent bank operations requires multiple sets of address or bank select interface signals. These signals are a subset of core interface signals 160, in FIG. 1. It is impractical for there to be an equal number of external pins 170 as there are core interface signals 160. In normal modes of operation for such DRAMs, relatively complex interface logic circuits decode encoded command protocol and decode it into the core interface signals. However, this protocol may be too complex for older memory test machines. Core noise testing described in FIGS. 6–9 provide a method for a Core Noise Test Mode, for testing DRAMs that have concurrent bank operations using a simple protocol and low circuit overhead.

For one embodiment, the worst case concurrent memory operations is one bank sense, one bank column read/write, and two bank precharge operations. In test mode there are only one set of address pins that are multiplexed for sense, precharge, and column address and bank. However, in normal mode all three operations can begin simultaneously. Therefore, the core noise option simulates, in test mode, the noise due to all three operations beginning simultaneously.

FIG. 6 is a flowchart of a DRAM operation flow for a bank. At block 610, the bank is sensed. At block 620, the process tests whether a column read/write operation will take place. In one embodiment, the column read/write operation may be skipped in this process. If there is a column read/write, the process continues to block 630, where a column read/write is performed. The process then returns to block 620. If there is no column read/write, the process continues directly to block 640. At block 640, a precharge is performed. The process then returns to block 610. For one embodiment, this cycle is performed for each bank in the memory. Of course, there may be times when a memory bank is idle. For one embodiment, once a bank is precharged, it remains precharged. A sensed bank remains sensed while it is column read/written.

Figure 7:
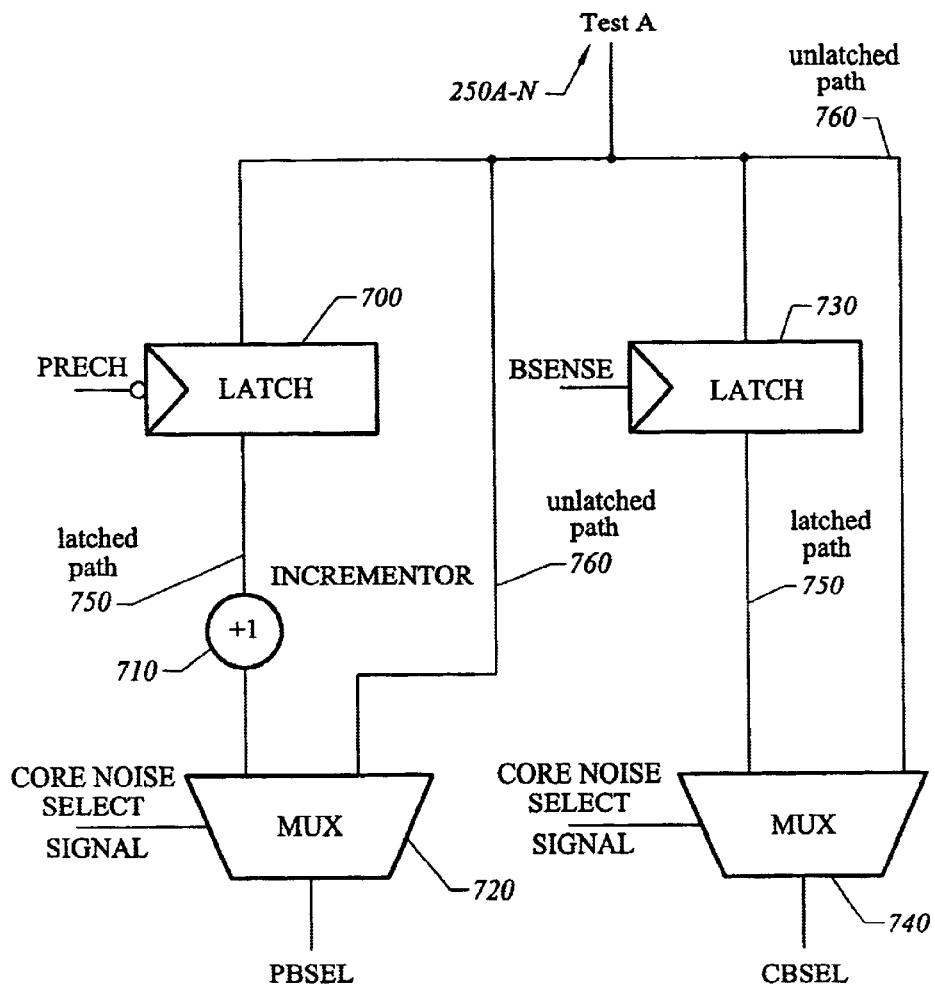
FIG. 7 shows one embodiment of a block diagram of the core noise test mode circuitry.

FIG. 7 shows one embodiment of the core noise test circuitry. The core noise logic 300 includes two latches 700 and 730, an incrementer 710, and two multiplexers 720 and 740. Latch 700 and incrementer 710 form one latched path 750. Latch 730 forms another latched path 750. For one embodiment, the unlatched paths 760 are used when the core noise option is disabled.

When the core noise option is enabled, RQ<7> acts as a select signal for multiplexers 720 and 740 and selects either the latched paths 750 or the unlatched paths 760. The column read/write latched path latches the column bank select signal, CBSEL, using latch 730, to the previously sensed bank signal. The precharge latch 700 latches the precharge bank select signal, PBSEL, to the previously precharged bank select signal. The incrementer 710 adds a one to the previously precharged bank signal. Thus, the precharge bank select signal is equal to the last precharged bank plus one. One is added so that the precharge bank will be between two previously sensed banks. Thus, both the previously sensed banks will precharge.

FIG. 8 is an illustration of one embodiment of banks tested by the core noise logic 300. The testing rules shown in FIG. 8 are determined based on the type of bank being tested. For one embodiment, the banks are dependent banks, and therefore, the rules specify that adjacent banks can not be tested, and that banks adjacent to a sensed bank are automatically locked. This is because adjacent banks share the same sense amps in a dependent bank structure. Alternative rules may be applied for non-dependent banks.

Two testing stages are shown. The first stage 810 senses bank 4, with precharge noise in banks 0 and 2, and column noise in bank 6. The second stage 820 senses bank 5, with precharge noise in banks 1 and 3 and column noise in bank 7. Of course, the selection of the banks tested is arbitrary. FIG. 8 merely shows an example of the core noise testing.

Ten banks are illustrated. However, another number of banks may be used. If this is the first cycle of testing, all banks are first precharged (not shown).

At step 1 (step 830), bank zero is precharged. For one embodiment, banks 2,4, and 6 are also precharged in this process, in any order, to verify that all banks are precharged. The last bank precharged, bank 0 in this instance, is latched by latch 700.

At step 2 (step 840), banks 0, 2, and 6 are sensed, in that order. The order of sensing banks 0 and 2 may be changed. However, the last bank sensed, bank 6 in this case, is latched by latch 730.

At step 3 (step 850), the core noise is tested. The core noise select signal is activated. Simultaneously bank 1 is precharged, while bank 6 is column read/written, and bank 4 is sensed. Note that the value of the bank being precharged, bank 1, is the incremented value from latch 700, while the value of bank 6 is the latched value from latch 730. In this way, only one bank address is sent to the memory, in order to perform these concurrent operations. This step 3 (step 850) tests the sense operation of bank 4 under the most adverse conditions possible. In order to return the banks to their previously precharged state, at step 4 (step 860), bank 5 is precharged. Precharging affects the adjacent two banks, therefore, by precharging bank 5, banks 4 and 6 are also precharged, returning the memory it its previous state. This completes the first stage 810, the testing of bank 4.

The second stage 820 is started by precharging bank 1, at step 1B (step 870). Then, banks 1, 3, and 7 are sensed, at step 2B (step 880). Next, the core noise select signal is enabled, and simultaneously bank 5 is sensed, while bank 7 is column read/written, and bank 2 is precharged. This is step 3B (step 890). In order to clean up, bank 6 is precharged at step 4B (step 895). As can be seen, the second stage 820 is almost identical to the first stage 810, with all of the banks shifted by one. This permits serial testing of the core noise option on all banks.

Figure 9:
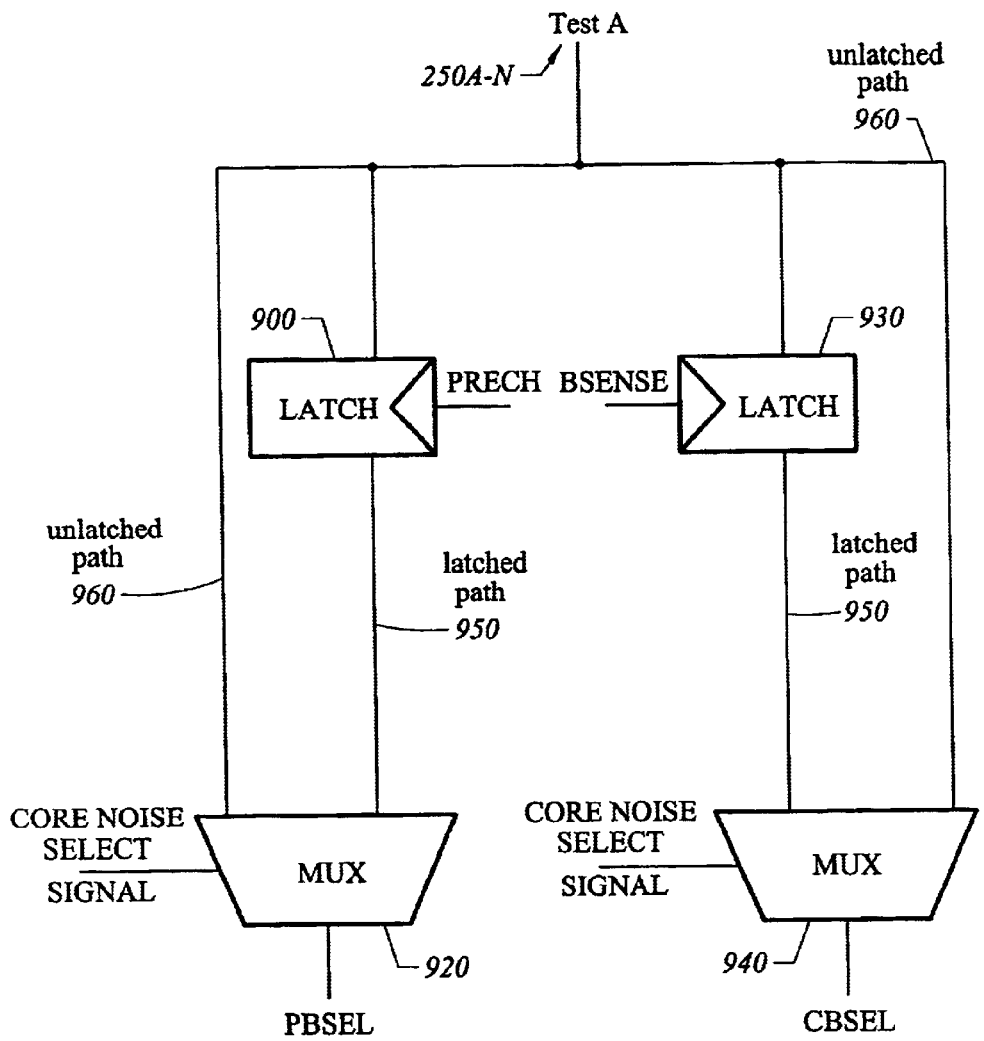
FIG. 9 shows another embodiment of a block diagram of the core noise test mode circuitry.

FIG. 9 shows another embodiment of the core noise logic 300. The core noise logic 300 includes two latches 910 and 930 and two multiplexers 920 and 940. Latch 900 forms one latched path 950. Latch 930 forms another latched path 950. For one embodiment, the unlatched paths 960 are used when the core noise option is disabled.

When the core noise option is enabled, RQ<7> acts as a select signal for multiplexers 920 and 940 and selects either the latched paths 950 or the unlatched paths 960. The column read/write latched path latches the column bank select signal, CBSEL, using latch 930, to the previously sensed bank signal 980. The precharge latch 900 latches the precharge bank select signal, PBSEL, to the previously precharged bank select signal 970. The precharge bank select signal is equal to the last precharged bank 970.

FIG. 10A is an illustration of another embodiment the banks tested by the core noise logic 300. The first stage 1005 senses bank 4, with precharge noise in banks 0 and 2, and column noise in bank 6. The second stage 1010 senses bank with precharge noise in banks 1 and 3 and column noise in bank 7.

Ten banks are illustrated. However, another number of banks may be used. If this is the first bank being tested, first, all of the banks are precharged. At step 1 (step 1015), bank 1 is precharged. For one embodiment, banks 2, 4, and 6 are also precharged in this process, in any order, to verify that all banks are precharged. The last bank precharged, bank 1 in this instance, is latched by latch 900.

At step 2 (step 1020), banks 0, 2, and 6 are sensed, in that order. The order of sensing banks 0 and 2 may be changed. However, the last bank sensed, bank 6 in this case, is latched by latch 930.

At step 3 (step 1025), the core noise is tested. The core noise select signal is activated. Simultaneously bank 1 is precharged, while bank 6 is column read/written, and bank 4 is sensed. Note that the value of bank 1 is the value from latch 900, while the value of bank 6 is the latched value from latch 930. In this way, only one bank address, that of bank 4, is sent to the memory, in order to perform these concurrent operations. This step 3 (step 1025) tests the sense operation of bank 4 under the most adverse conditions possible. In order to return the banks to their previously precharged state, at step 4 (step 1030), bank 5 is precharged. Precharging affects the adjacent two banks, therefore, by precharging bank 5, banks 4 and 6 are also precharged, returning the memory it its previous state. This completes the first stage 1005, the testing of bank 4.

The second stage 1010 is started by precharging bank 2, at step 1B (step 1035). Then, banks 1, 3, and 7 are sensed, at step 2B (step 1040). Next, the core noise select signal is enabled, and simultaneously bank 5 is sensed, while bank 7 is column read/written, and bank 2 is precharged. This is step 3B (step 1045). In order to clean up, bank 6 is precharged at step 4B (step 1048). As can be seen, the second stage 1010 is almost identical to the first stage 1005, with all of the banks shifted by one. This permits serial testing of the core noise option on all banks.

FIG. 10B is an illustration of yet another embodiment of the banks tested by the core noise logic 300. The banks shown in FIG. 10B are independent banks. This means that when one bank is precharged it does not affect neighboring banks. This also means that when a bank is sensed, the neighboring banks need not be locked, since they can be accessed without any problems. As can be seen from the states and rules of state change, there is no locked state needed for independent banks. FIG. 10B illustrates four memory banks. Of course, this technique may be extended to any number of banks.

At stage 1 (step 1050) bank 1 is sensed, while adjacent banks 0 and 2 are precharged and column read/written, respectively. At stage 2 (step 1055) bank 2 is sensed while banks 1 and 3 are respectively precharged and column read/written.

First, if this stage is the first stage, all banks are precharged. If this is not the first stage, then the last stage left all banks already precharged.

At step 1 (step 1060) bank 0 is precharged. Latch 900 latches the address of bank 0.

At step 2 (step 1065) banks 0 and 2 are sensed, in that order. Because bank 2 is the last bank sensed, latch 930 contains the address of bank 2.

At step 3 (step 1070) the core noise is tested. The core noise select signal is asserted. Bank 1 is sensed, while bank zero is precharged, and bank 2 is column written/read. The address of bank 0 is from latch 900, while the address of bank 2 is from latch 930. Therefore, only the address of bank 1 is sent over the address lines.

At step 4 (step 1075) bank 2 is precharged. Because the memory illustrated has independent banks, the precharging of bank 2 does not affect the neighboring banks.

At step 1B (step 1080) bank 1 is precharged. Again, the address of bank 1 is captured by latch 900. At step 2B (step 1085) banks 1 and 3 are sensed, in that order. Latch 930 latches the address of bank 3. At step 3B (step 1090) the core noise select signal is asserted, bank 2 is sensed, bank 1 is precharged, and bank 2 is column read/written. At step 4B (step 1095) bank 3 is precharged. As can be seen, stage 2 1055 parallels stage 1 1050. In this way, the other banks can also tested.

In the foregoing specification, the invention has been described with reference to exemplary embodiments thereof. It will, however, be evident that various modifications and changes may be made thereof without departing from the broader spirit and scope of the invention as set forth in the appended claims. The specifications and drawings are, accordingly, to be regarded in an illustrative rather than a restrictive sense.

What is claimed is:

1. A memory, comprising:

a plurality of pins;

a memory core having a plurality of banks; and, a reconfigurable memory interface to provide a direct path between the plurality of pins and the memory core when the memory is in a test mode, the reconfigurable memory interface having a core noise logic to simulate concurrent memory operations, wherein the concurrent memory operations comprise one bank sense, one bank column read/write, and two bank precharge operations, wherein the one column read/write is performed on a bank previously sensed.

2. A memory, comprising:

a plurality of pins;

a memory core having a plurality of banks; and, a reconfigurable memory interface to provide a direct path between the plurality of pins and the memory core when the memory is in a test mode, the reconfigurable memory interface having a core noise logic to simulate concurrent memory operations, wherein the concurrent memory operations comprise one bank sense, one bank column read/write, and two bank precharge operations, wherein a first of the two precharge operations is performed on a bank previously precharged plus one.

3. A method for testing a memory device, comprising the steps of:

entering a test mode to redefine the functionality of a memory pin to provide a direct path between the memory pin and a memory core;

performing a memory test including enabling a core noise logic that simulates concurrent memory operations comprising one bank sense, one column read/write and two bank precharge operations;

performing the one column read/write on a bank that was previously sensed; and, exiting the test mode.

4. A method for testing a memory device, comprising the steps of:

entering a test mode to redefine the functionality of a memory pin to provide a direct path between the memory pin and a memory core;

performing a memory test including enabling a core noise logic that simulates concurrent memory operations comprising one bank sense, one column read/write and two bank precharge operations;

performing the one column read/write on a bank that was previously sensed;

performing the precharge on a bank that was previously precharged plus one; and, exiting the test mode.

* * * * *